Jan. 6, 1970 D. BOSWELL 3,487,541

PRINTED CIRCUITS

Filed June 19, 1967 3 Sheets-Sheet 1

Inventor
DAVID BOSWELL
By Percy P. Lantzy
Attorney

Inventor
DAVID BOSWELL
By
Attorney

Jan. 6, 1970 D. BOSWELL 3,487,541

PRINTED CIRCUITS

Filed June 19, 1967 3 Sheets-Sheet 3

Inventor
DAVID BOSWELL
By [signature]
Attorney

United States Patent Office 3,487,541

Patented Jan. 6, 1970

3,487,541

PRINTED CIRCUITS

David Boswell, London, England, assignor to International Standard Electric Corporation, New York, N.Y., a corporation of Delaware Filed June 19, 1967, Ser. No. 646,987
Claims priority, application Great Britain, July 22, 1966, 33,056/66
Int. Cl. H05k *3/30;* H01r *9/00*
U.S. Cl. 29—626 7 Claims

ABSTRACT OF THE DISCLOSURE

In hybrid chip circuits, particularly in cases where a number of leads are concerned, the leads joining contact areas on a chip to conduct lands on the substrate should be flexible. In the present disclosure flexible contact fingers, integral with conductor lands, are made by first depositing on the substrate material which afterwards is to be selectively etched away and then coating the substrate and the said material with a conductive coating in the pattern of the desired contact fingers and conductor lands. The material underneath the fingers is then etched away, the chip is placed in position and the fingers and corresponding contact areas on the chip are joined up. In the case of a flip-chip arrangement, the chip may be mounted before the material under the fingers is removed.

BACKGROUND OF THE INVENTION

This invention relates to mounted electrical device assemblies of the kind where a die containing an electrical circuit component is mounted upon a substrate and is concerned with the provision of interconnecting leads from respective electrode areas on the die to corresponding conductor lands on the substrate.

It is common practice to mount semiconductor dice onto substrates carrying film circuits or printed circuits. In some cases the die is mounted face upwards—that is with its electrode contact areas uppermost—and connection between the electric contact areas and conductor lands on the substrate is made by means of thin jumper wires which extend over the edges of the die. See, e.g., U.S. Patent Nos. 3,082,327 and 3,011,379. In other cases—familiarly referred to as "flip-chip"—the die is mounted face downwards and its contact areas are bonded to respective conductor lands on the substrate. See, e.g., U.S. Patent No. 3,292,240.

A variety of methods have been used for joining the electrode contact areas of a die to the respective conductor lands or jumper wires. The die may include an integrated circuit having a plurality of separate or structurally integrated transistors, diodes, resistors and capacitors formed on the same piece of semiconductor material. The problem then arises, particularly in the case of a flip-chip arrangement, of making simultaneously or one-at-a-time several separate bonds between respective electrode contact areas on the die and conductor lands on the substrate. Another problem common to nearly all cases where dice are mounted on substrates is to achieve an assembly capable of withstanding thermal shock and mechanical forces such as those due to violent acceleration. Silicon dice commonly employ passivating films of oxide with conductor layers, forming the electrode contact areas, deposited over the passivating oxide. The problem then arises of providing adequate adhesion of the conductor layers.

SUMMARY

In the present invention, alleviation of the aforementioned difficulties is achieved by providing flexible leads for interconnection between electrode areas on the semiconductor die and corresponding conductor lands on the substrate.

In accordance with one aspect of the present invention there is provided a mounted semiconductor device assembly including a substrate, a set of flexible contact fingers spaced from the substrate over an area thereof, each finger being integral with a conductor land bonded to the substrate, and a semiconductor die having electrode contact areas united to respective ones of said fingers .

For the production of a device as specified above, the invention provides a process for manufacturing a mounted semiconductor device assembly having a die of semiconductor material secured to a substrate with a set of contact fingers joining respective electrode contact areas on the die to corresponding conductor lands on the substrate, the fingers extending over and/or under the die, said process including the steps of (i) coating an area of the substrate with etchable material chemically different from that of both the substrate and the fingers, (ii) covering the surface of the substrate, including the coating of chemically different material, with adherent conductive material in a pattern corresponding to that of the set of fingers and the corresponding conductor lands, (iii) removing the chemically different material by selective etching to leave the set of fingers spaced above the substrate, (iv) positioning the die under or over the fingers, as may be required, and (v) uniting the electrode contact areas to their respective fingers.

IN THE DRAWINGS

Figure 11:
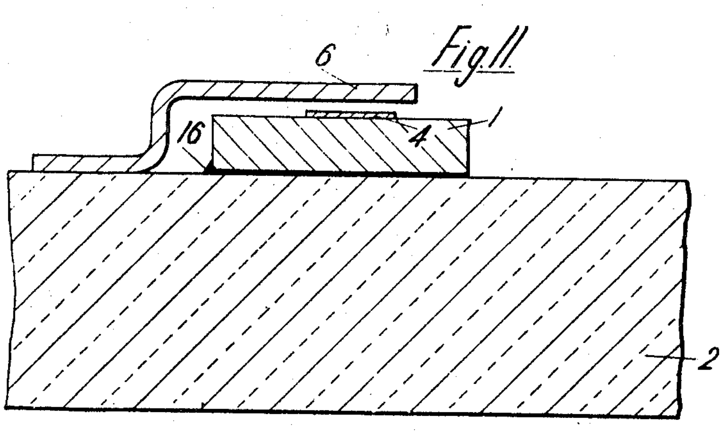
Figure 12:
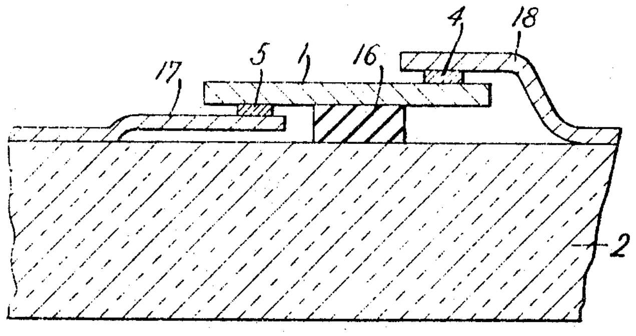

FIGS. 7 and 8, and FIGS. 9 and 10 illustrate, similarly, further successive steps in the manufacture of a device according to the invention;

FIG. 11 is an enlarged view in cross-section of part of a die positioned on its substrate below a contact finger prior to the lead being bonded to the die; and FIG. 12 illustrates, similarly to FIGS. 1 and 2, an embodiment of the invention wherein the die is supported on the substrate independently of the contact fingers and wherein respective contact fingers, raised above the substrate are connected to contact areas on both upper and lower surfaces of the die.

DETAILED DESCRIPTION

Figure 1:
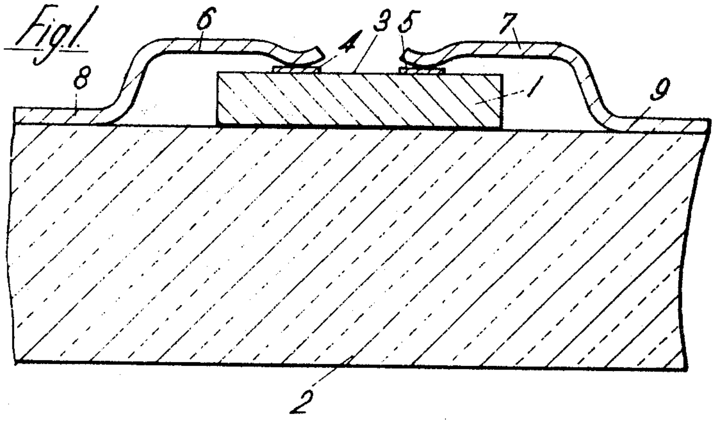
FIG. 1 illustrates diagrammatically an enlarged cross-section through a substrate having a die mounted thereon with contact fingers joined to respective contact areas on the upper surfaces of the die.

In the embodiment of FIG. 1 a semiconductor die 1 (comprising e.g., silicon) is bonded to a glass or ceramic substrate 2. The die contains regions of differently doped semiconductor material to form one or more junction devices such as transistors or diodes. Contact areas for the electrodes of the device or devices are provided on the upper surface 3 of the die. The present invention is not concerned with the production of the die itself. Typically the die may incorporate but a single semiconductor junction device or, more usually an integrated circuit consisting of several devices such as transistors, diodes, resistors and capacitors formed in the basic semiconductor material and interconnected, as may be required, by circuit paths within or on the surface of the die.

The die is provided with a set of contact areas such as 4 and 5 formed at respective different regions of the upper surface 3. Further circuits or circuit components may be carried or formed on the substrate 2. Interconnections between the several electrode areas on the surface 3 and other circuit components or terminals on the substrate 2 are provided by respective contact fingers such as 6 and 7. According to the present invention these contact fingers are made integral with respective conductor lands 8 and 9 bonded to the substrate. They bridge over the edges of the die 1 and their ends are bonded, by thermocompression bonding, welding, or other means common to the art, to the corresponding electrode contact areas.

The length and shape of the fingers between the electrode contact areas and the regions where they join the substrate conductor lands are such as to provide a degree of resilience and compliance which will assist in safeguarding the bonds to the electrode contact areas and to the substrate against thermal and mechanical shock. In the conventional inverted "chip" device assembly where the chip is bonded directly to its substrate, the fine connecting wires have to be bonded not only to the respective (uppermost) electrode contact areas but also to separate conductor lands formed on the substrate. Thus there is a separate joint at each end of each lead wire. In the present invention one joint of each interconnecting lead is eliminated by the use of contact fingers integral with the substrate conductor lands.

Figure 2:
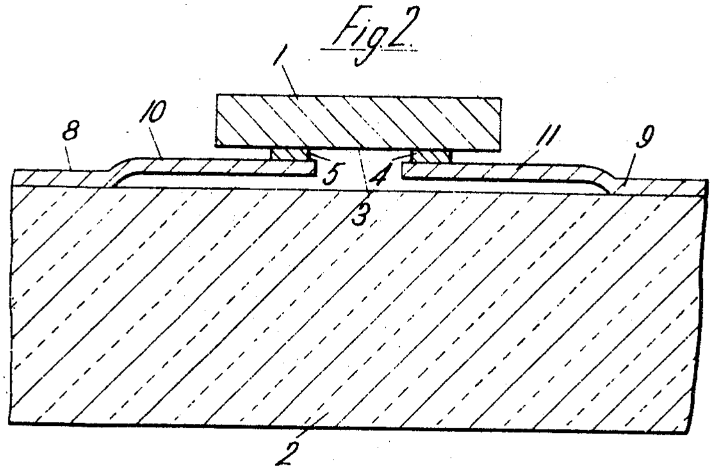
FIG. 2 illustrates, similarly, a "flip-chip" embodiment of the invention with the die supported on the contact fingers.

In the device of FIG. 2 contact fingers 10 and 11 are again provided integral with respective conductor lands 8 and 9 bonded to the substrate 2. The ends of the fingers are spaced above the surface of the substrate. In this embodiment, however, the die 1 is "flipped" over so that its contact areas 4, 5 rest upon the ends of the fingers 10, 11, which are then bonded to the respective contact areas in the normal way.

In "flip-chip" arrangements heretofore the contact areas on the chip are joined directly to lands bonded throughout their length to the substrate. In the embodiment of the present invention herein illustrated, the ends of the fingers are cantilevered above the surface of the substrate and hence provide a degree of resilience and compliance for the connections to the die 1. If desired, the die 1 may be directly bonded to the substrate 2 at points intermediate the fingers so that the mass of the die is not carried by the contact fingers. Alternatively, as suggested by the illustration of FIG. 2, the die may be supported solely by the contact fingers.

Figure 3:
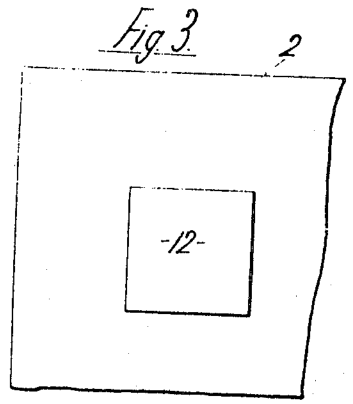
FIGS. 3 and 4 show diagrammatically a plan view and a cross-sectional view of part of a substrate, illustrating one step in a method of manufacture according to the invention.
Figure 4:
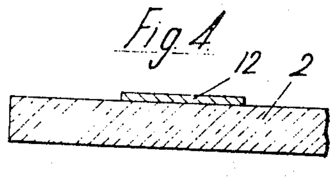

In the manufacture of devices such as illustrated in FIGS. 1 and 2, an area of the substrate, corresponding to the area in which it is desired to have spacing between the substrate and the contact fingers, is coated with a layer 12 of material chemically different both from the substrate 2 and from the material of the contact fingers, as illustrated in FIGS. 3 and 4. This chemically different material is later on to be removed by selective etching and hence a suitable material is chosen with this end in view. For a glass substrate and contact fingers formed from gold a suitable material is aluminum which may subsequently be removed by a caustic soda (sodium hydroxide) and potassium bromide solution. The materials may be applied sequentially by glueing or spraying or painting or chemical plating or by vapour deposition or by any other known method.

Figure 5:
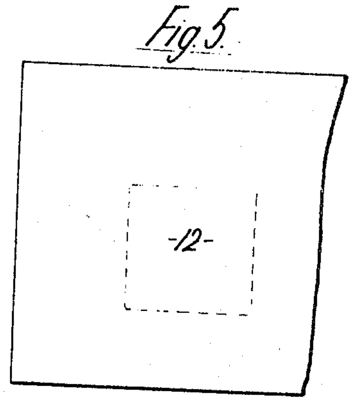
FIGS. 5 and 6 illustrate a further step in the method of manufacture.
Figure 6:
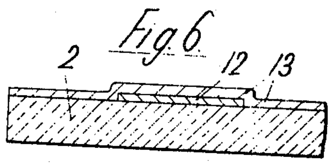

The next stage of the manufacturing process, illustrated in FIGS. 5 and 6, is is to coat the substrate 2 and the layer 12 with conductive material which will adhere firmly to the substrate. This coating may conveniently be applied by vapour deposition, plating or screen printing. It may cover the whole of the substrate as shown in FIGS. 5 and 6 or, if desired, may be masked off into discrete areas, which areas, however should include any such areas as 12 which are later to be etched away to leave contact fingers supported above the substrate.

Figure 7:
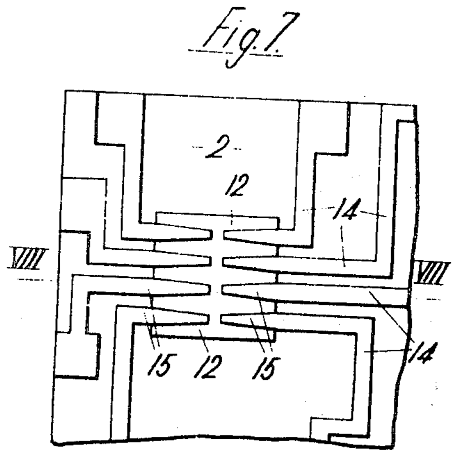
Figure 9:
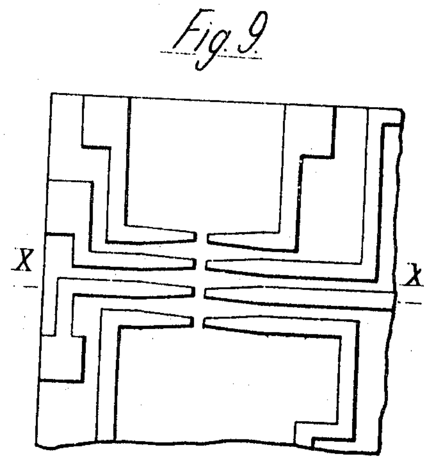
Figure 8:
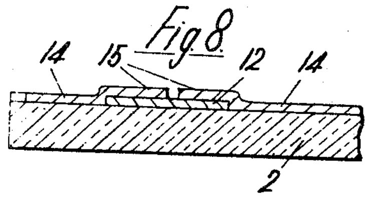

The next stage in the manufacturing process is to subdivide the conductive coating 13 into the desired pattern of conductor lands 14 and integral contact fingers 15, as illustrated in FIGS. 7 and 8.

The pattern of conductor lands 14 and contact fingers 15 may be formed by a conventional photoetching process in which the pattern is first printed on the conductor layer 13, the unwanted conductor areas are etched away, and the photoresist on the actual conductor pattern is then removed in conventional manner. It is pointed out that the material of the areas 12 need not necessarily be resistant to the chemicals used in the photoetching process for the production of the conductor pattern.

The lengths of the fingers 15 are made such (if the fingers are to bridge over a die and be bonded to contact areas on the upper surface of the die) that their ends come into correct positions when, eventually, the fingers 15, after removal of the material 12, are bent up from the substrate to accommodate a die.

Figure 10:
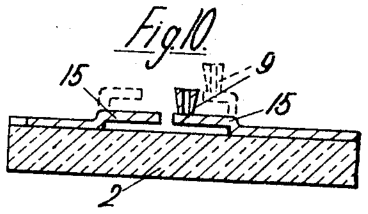

The next operation depends upon whether a device of the kind illustrated in FIG. 1 or of that illustrated in FIG. 2 is to be provided. Taking the case of a device of the FIG. 1 type, the material 12 is first selectively etched away from the substrate and the overlying contact fingers. A multihead vacuum chuck, nozzles of which are represented at 9 in FIG. 10, is lowered over the fingers 15 and, with vacuum applied, is raised to draw the fingers up above the surface of substrate 2 by a desired amount to permit the semiconductor die to be slid underneath them. As illustrated in FIG. 11, after the die 1 has been slid into position and, if desired, bonded to the substrate 2 as indicated at 16, a finger 6 will lie above a contact area 4 on the die 1. The final operation, insofar as the finger is concerned, is to bond it to the electrode contact area 4, for example by thermocompression bonding, and so achieve the connection illustrated in FIG. 1.

For the "flip-chip" device of FIG. 2, after the conductor land and contact finger pattern represented in FIGS. 7 and 8 has been formed, the remaining stages of fabrication may follow either of two alternative series of steps. In the first of these the die 1 is positioned over the fingers 15 and the electrode contact areas on the die are bonded to their respective fingers by any of the methods used in fabrication of the conventional "flip-chip" device. The material 12 is then selectively etched out from under the fingers 15 after the die has been secured to the fingers.

In the other method of fabrication of a FIG. 2 device, after the stage illustrated in FIGS. 7 and 8, the material 12 is etched out, leaving the fingers 15 projecting over the surface of the substrate 2. The die 1 is then lowered into position over the fingers and its contact areas are bonded to the respective fingers either simultaneously, as by the application of heat to the die 1, or individually, as by directing a laser beam through the glass of the substrate 2 onto the fingers.

The invention may be used for the case where contact fingers are required both under and over the die. In this case the material 12 is etched out, leaving two sets of fingers, one of which is raised with the help of suction nozzles as described above with reference to FIG. 10; the die is then slid under this set of fingers and over the other, and the fingers are bonded to their respective contact areas as previously described.

Such an arrangement is shown in FIG. 12. In this case the die 1 is secured to the substrate by means of an adhesive area 16 which raises it above the level of contact finger 17, which itself is raised above the surface of the substrate, the finger 12 is bonded to a contact area 5 on the under surface of the die, while another finger 18 is bent up from the substrate and bonded to a contact area 4 on the upper surface of the substrate.

While the principles of the invention have been described above in connection with specific embodiments, and particular modifications thereof, it is to be clearly understood that this description is made only by way of example and not as a limitation on the scope of the invention.

I claim:

1. A process for manufacturing an electrical circuit assembly, said assembly including (i) a substrate having a plurality of electrical conductors thereon, each conductor having an associated conductor land on a major surface of said substrate, and (ii) an electrical circuit component in the form of a wafer mounted adjacent said major surface, said wafer having upper and lower opposed surfaces, said upper surface having a plurality of electrode contact areas thereon, each of said areas being associated with a corresponding one of said substrate conductor lands, comprising the steps of:

depositing on a limited area of said major surface a layer of removable material;

depositing on selected portions of said removable layer and said substrate a conductive layer forming a plurality of fingers, each of said fingers having one end portion disposed adjacent one of said substrate conductor lands and another end portion adapted to register with a corresponding one of said electrode contact areas, each of said fingers having said one end portion disposed on said major surface and said other end portion disposed on said removable layer;

removing said removable layer without substantially disturbing said other end portions of said fingers;

applying a vacuum to the other end portions of said fingers to raise the other end portions sufficiently away from said limited area so as to permit said wafer to be slid underneath said raised portions of said fingers;

placing said wafer adjacent said major surface so that each of said electrode contact areas underlies a corresponding one of said other end portions; and providing an electrical and mechanical bond between the overlying other end portion of each of said fingers and the corresponding electrode contact area.

2. A process according to claim 1, wherein said removing step comprises selectively etching said removable layer.

3. A process according to claim 2, wherein said removable layer comprises aluminum and said conductive layer comprises gold.

4. A process according to claim 1, wherein said fingers are formed by photoetching said conductive layer.

5. A process according to claim 4, wherein at least a portion of said removable layer is removed during said photoetching step.

6. A process according to claim 1, wherein the wafer is bonded to the substrate.

7. A process according to claim 1, wherein each of said opposed surfaces contains at least one of said electrode contact areas, the fingers contacting electrode areas on the upper surface of said wafer extending over the wafer edge in cantilever fashion.

References Cited

UNITED STATES PATENTS

| | | | |
|---|---|---|---|
| 3,098,951 | 7/1963 | Ayers et al. | |
| 3,248,779 | 5/1966 | Yuska et al. | 29—626 |
| 3,307,239 | 3/1967 | Lepseter et al. | 29—591 |
| 3,308,526 | 3/1967 | Jellig | 29—630 |
| 3,325,882 | 6/1967 | Chiou et al. | 29—591 |
| 3,342,927 | 9/1967 | Kubik et al. | 174—68 |
| 3,390,308 | 6/1968 | Marley. | |
| 3,396,459 | 8/1968 | Freehauf et al. | 29—626 XR |

JOHN F. CAMPBELL, Primary Examiner

R. W. CHURCH, Assistant Examiner

U.S. Cl. X.R.

29—203, 577, 591, 625, 630; 117—212; 156—3; 174—68.5; 317—234